United States Patent
Zidar

(10) Patent No.: US 9,816,555 B2
(45) Date of Patent: Nov. 14, 2017

(54) MULTI-LAYER SLIDING BEARING

(71) Applicant: Miba Gleitlager Austria GmbH, Laakirchen (AT)

(72) Inventor: Jakob Zidar, Altmuenster (AT)

(73) Assignee: Miba Gleitlager Austria GmbH, Laakirchen (AT)

( * ) Notice: Subject to any disclaimer, the term of this patent is extended or adjusted under 35 U.S.C. 154(b) by 0 days.

(21) Appl. No.: 15/107,197

(22) PCT Filed: Dec. 18, 2014

(86) PCT No.: PCT/AT2014/050304
§ 371 (c)(1),
(2) Date: Jun. 22, 2016

(87) PCT Pub. No.: WO2015/095906
PCT Pub. Date: Jul. 2, 2015

(65) Prior Publication Data
US 2017/0030408 A1    Feb. 2, 2017

(30) Foreign Application Priority Data

Dec. 23, 2013 (AT) .............................. A 50851/2013

(51) Int. Cl.
*F16C 33/12* (2006.01)
*C22C 13/00* (2006.01)
(Continued)

(52) U.S. Cl.
CPC ............ *F16C 33/124* (2013.01); *C22C 13/00* (2013.01); *C23C 8/06* (2013.01); *C23C 8/14* (2013.01);
(Continued)

(58) Field of Classification Search
CPC .... F16C 17/02; F16C 33/124; F16C 2204/34; F16C 2223/70; F16C 2240/60;
(Continued)

(56) References Cited

U.S. PATENT DOCUMENTS 2,641,596 A  *  6/1953  Leistner ................ C07F 7/2268
                                                    524/111
4,072,368 A  *  2/1978  Ehrentraut ............. F16C 33/12
                                                    384/295

(Continued)

FOREIGN PATENT DOCUMENTS

AT        509 112 A1      6/2011
CA        2858004 A1 *    7/2013  ............... C25D 5/48
(Continued)

OTHER PUBLICATIONS

International Search Report of PCT/AT2014/050304, dated May 6, 2015.

*Primary Examiner* — Marcus Charles
(74) *Attorney, Agent, or Firm* — Collard & Roe, P.C.

(57) ABSTRACT

A multi-layer sliding bearing includes a sliding layer having a surface for contacting a component which is to be mounted. The sliding layer is made from a tin-based alloy with tin as the main alloy element and the sliding layer has on the surface, at least in sections, an oxidic subcoating in which the proportion of tin oxide(s) is at least 50% in weight.

10 Claims, 1 Drawing Sheet

(51) Int. Cl.
*C25D 11/34* (2006.01)
*C25D 7/10* (2006.01)
*F16C 17/02* (2006.01)
*C23C 16/44* (2006.01)
*C23C 28/00* (2006.01)
*C23C 8/06* (2006.01)
*C23C 8/14* (2006.01)
*C23C 8/18* (2006.01)
*C23C 8/80* (2006.01)

(52) U.S. Cl.
CPC ............... *C23C 8/18* (2013.01); *C23C 8/80* (2013.01); *C23C 16/44* (2013.01); *C23C 28/321* (2013.01); *C23C 28/345* (2013.01); *C25D 7/10* (2013.01); *C25D 11/34* (2013.01); *F16C 17/02* (2013.01); *F16C 2204/34* (2013.01); *F16C 2223/70* (2013.01); *F16C 2240/60* (2013.01)

(58) Field of Classification Search
CPC ........ F16C 17/26; F16C 33/12; F16C 33/128; F16C 2223/30; F16C 2204/36; F16C 2204/12; C23C 8/06; C23C 8/14; C23C 8/18; C23C 8/80; C23C 16/44; C23C 28/321; C23C 28/345; C23C 14/5873; C23C 16/04; C23C 24/103; C25D 3/30; C25D 7/10; C25D 8/18; C25D 11/34; C22C 13/00
USPC ....... 384/176, 288, 294, 625, 902, 912–913; 428/613, 632, 646; 29/898.12–898.15
See application file for complete search history.

(56) References Cited

U.S. PATENT DOCUMENTS

| | | | | |
|---|---|---|---|---|
| 5,328,772 A * | 7/1994 | Tanaka | ............ | F16C 33/121 419/28 |
| 5,387,461 A * | 2/1995 | Kamiya | ............ | F16C 33/12 384/625 |
| 5,976,712 A * | 11/1999 | Staschko | ............ | C25D 3/56 428/614 |
| 6,139,191 A * | 10/2000 | Andler | ............ | C23C 14/06 384/276 |
| 6,312,579 B1 * | 11/2001 | Bank | ............ | C25D 5/10 205/102 |
| 6,575,635 B1 | 6/2003 | Tsuji et al. | | |
| 6,800,377 B2 * | 10/2004 | Takayanagi | ............ | B32B 15/012 384/912 |
| 7,229,699 B2 * | 6/2007 | Toth | ............ | C23C 4/02 29/898.12 |
| 8,235,596 B2 * | 8/2012 | Suzuki | ............ | F16C 9/06 384/294 |
| 9,074,627 B2 | 7/2015 | Zidar | | |
| 2003/0118862 A1 * | 6/2003 | Kawachi | ............ | B32B 15/013 384/912 |
| 2007/0254180 A1 * | 11/2007 | Ababneh | ............ | B32B 15/015 428/677 |
| 2009/0312206 A1 | 12/2009 | Miyasaka | | |
| 2010/0047605 A1 * | 2/2010 | Knoblauch | ............ | F16C 33/14 428/554 |
| 2013/0052473 A1 * | 2/2013 | Sato | ............ | B22F 7/04 428/564 |
| 2013/0316140 A1 * | 11/2013 | Lu | ............ | C03C 17/3417 428/142 |
| 2013/0330572 A1 | 12/2013 | Staschko et al. | | |

FOREIGN PATENT DOCUMENTS

| | | | | |
|---|---|---|---|---|
| CA | 2869032 A1 * | 10/2013 | ............ | C25D 5/12 |
| DE | 29 16 411 A1 | 10/1979 | | |
| DE | 100 54 461 A1 | 5/2001 | | |
| DE | 10 2010 040 469 B3 | 1/2012 | | |
| EP | 2103822 A1 * | 9/2009 | ............ | F16C 9/06 |
| EP | 2 135 969 A1 | 12/2009 | | |
| GB | 2 020 695 B | 11/1979 | | |
| JP | 2005-054237 A | 3/2005 | | |
| JP | 2005-179392 A | 7/2005 | | |
| JP | 2009-270176 A | 11/2009 | | |
| JP | 5354939 B2 * | 11/2013 | ............ | F16C 9/06 |

\* cited by examiner

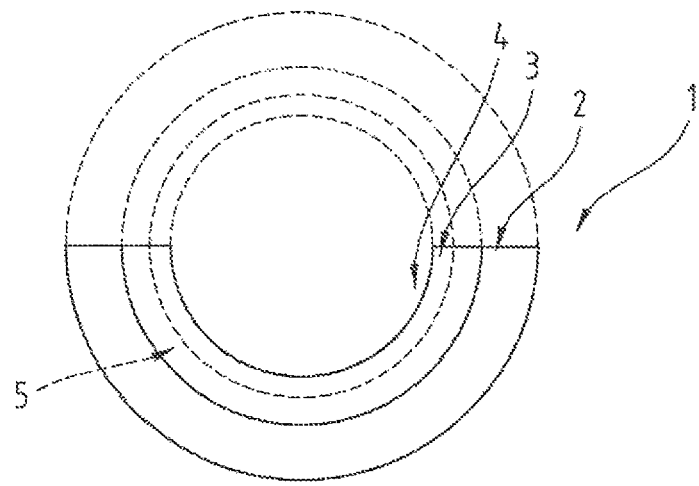
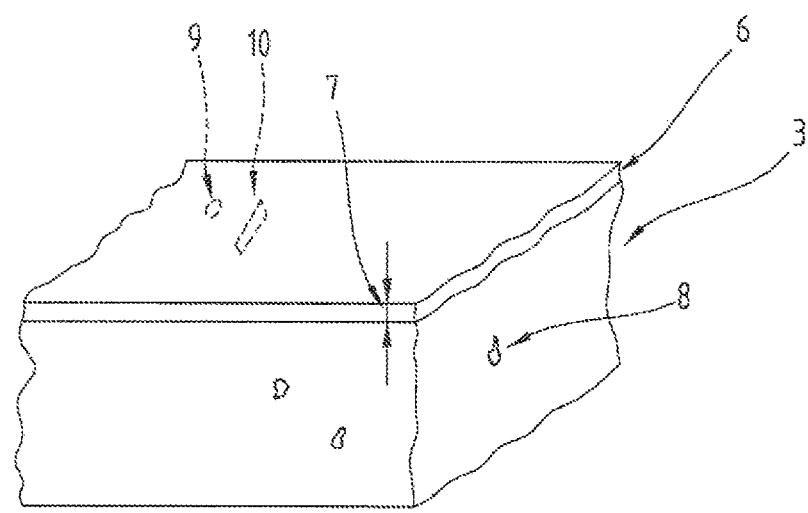

MULTI-LAYER SLIDING BEARING

CROSS REFERENCE TO RELATED APPLICATIONS

This application is the National Stage of PCT/AT2014/050304 filed on Dec. 18, 2014, which claims priority under 35 U.S.C. §119 of Austrian Application No. A 50851/2013 filed on Dec. 23, 2013, the disclosure of which is incorporated by reference. The international application under PCT article 21(2) was not published in English.

BACKGROUND OF THE INVENTION

1. Field of the Invention

The invention relates to a multi-layer sliding bearing comprising a sliding layer having a surface for contacting a component which is to be mounted, wherein the sliding layer is made from a tin-based alloy with tin as the main alloy element.

2. Description of the Related Art

Tin-based alloys have already been used for a long time as materials for sliding bearings in the motor industry. Only the keyword white metal is mentioned in this connection.

In the relevant literature various different compositions and forms of tin-based alloys are described, as the demands made on sliding bearings have changed over time due to improved, engines and operating means for engines. For example AT 509 112 A1 is mentioned, which discloses a sliding layer for a multi-layer sliding bearing made from a tin-based alloy, which in addition to tin as the main alloy element contains at least one element from the group including antimony and copper, possibly lead and/or bismuth, as well as unavoidable impurities originating from the production of the elements, wherein the proportion of antimony is a maximum of 20 wt. %, the proportion of copper is a maximum of 10 wt. %, the total proportion of lead and bismuth is a maximum of 1.5 wt. % and the total proportion of copper and antimony is between 2 wt. % and 22 wt. %, and wherein tin is present in the form of intermetallic phases and as a tin phase with beta-tin grains in a specific orientation.

From the known, prior art in U.S. Pat. No. 5,387,461 A it is also known to produce a layer consisting of a mixture of aluminum oxide and tin oxide by means of anodic oxidation for aluminum-based sliding bearing alloys in order to improve the resistance to corrosion in this way. The tin oxide is used here as a solid lubricant.

SUMMARY OF THE INVENTION

The underlying objective of the present invention is to provide a multi-layer sliding bearing with a tin-based sliding layer which has an improved load-bearing capacity.

The objective is achieved in the aforementioned multi-layer sliding bearing in that the sliding layer has an oxidic subcoating on the surface at least in some sections, in which the proportion of tin oxide is at least 50 wt. %.

It is an advantage in (his case that hi this way the effect of brief temperature peaks on the relatively low-melting base material of the sliding layer can be reduced. Without being bound to explain the effect it is suspected that, this is caused on the one hand as tin oxide has a significantly poorer thermal conductivity than the tin of the tin-based alloy. On the other hand phase conversions could also play a role in that the tin oxide reacts to elementary tin and tetravalent tin oxide. This phase conversion is associated with power consumption which leads to a reduction in the temperature load. With a proportion of tin oxide in the oxidic subcoating that is less than 50 wt. % the said effect of reducing the effect of temperature peaks on the load-bearing capacity of the sliding layer was observed, however this was too low to achieve a significant improvement in load-bearing capacity. A further advantage of the multi-layer sliding bearing, according to the invention is that the oxidic subcoating can be made from the sliding layer itself so that it is not necessary to perform an additional deposition process for an oxide layer on the sliding layer which, is later in contact with the lubricant, although separate deposition is possible of course, in addition, by producing the oxidic subcoating from the material of the sliding layer itself a better adhesion of the subcoating is achieved.

According to a preferred embodiment variant of the multi-layer sliding bearing it is possible that the oxidic subcoating extends over at least 80% of the surface. In this way an improvement in the aforementioned effects is achieved, in particular with regard to the reduced thermal conductivity of the sliding layer on the surface.

Preferably, at least 50% of the surface of the oxidic subcoating has a layer thickness which is at least 0.1 μm. In this way a significant improvement in the thermal barrier effect of the oxidic subcoating was achieved. Furthermore, with a layer thickness of at least 0.1 μm the underlying tin-based material is better protected from corrosion.

Furthermore, it is preferable if at least 50% of the surface of the oxidic subcoating has a layer thickness which, is maximum of 2 μm. In this way the oxidic subcoating is still so "flexible" that it participates hi the adjustment of the underlying parts of the sliding layer made of the tin-based alloy to the component to the supported, for example a shaft, at least largely without causing damage.

According to another embodiment variant of the multi-layer sliding hearing it is possible that the sliding layer has oxidic areas underneath the oxidic subcoating. In this way the aforementioned effects can be improved further without an oxidic subcoating, which has a greater layer thickness, having to be applied onto the surface of the sliding layer.

The tin oxide can be present in particular by more than 40 wt. % in the modification romarchite. It could be observed that the aforementioned effects are improved in this way. As already explained above, it is assumed that the improvement in the temperature stability is also performed by the energy use of phase conversions. Romarchite can be converted by mechanical loading into the red SnO modification with an orthorhombic structure, before the SnO converts into Sn and $SnO_2$. As the mechanical loading on the sliding bearing can increase with, temperature, as a result of the reduction in the viscosity of the lubricant oil, it is also possible in this way to reduce the increase in temperature.

According to one embodiment variant tetravalent tin oxide can also be included in the oxidic subcoating in addition to romarchite. In this way in addition to improving the temperature stability of the sliding bearing within limits a polishing effect is achieved on the surface of the supporting component, whereby the run-in behavior of the tin oxide layer can be improved.

For reasons explained in more detail, in the following, the oxidic subcoating can contain at least one non-metallic element which is selected from a group comprising carbon, hydrogen and sulfur, or according to an additional embodiment variant it is possible for the oxidic subcoating to contain at least one element selected from a group comprising antimony, copper, indium, bismuth, lead and the oxides of said elements and the sulfides of said elements.

It is also possible that the oxidic subcoating comprises pores and/or cracks. In this way the lubricant can penetrate into said pores and/or cracks of the oxidic subcoating, whereby the thermal barrier effect of the oxidic subcoating can be improved further.

For a better understanding of the invention the latter is explained in more detail with reference to the following Figures.

BRIEF DESCRIPTION OF THE DRAWINGS

In a simplified, schematic representation:

FIG. 1 shows a multi-layer sliding bearing in the form of a sliding bearing half shell in side view;

FIG. 2 shows a cross-section, of a section of a sliding layer in an oblique view.

First of all, it should be noted that the details relating to position used in the description, such as e.g. top, bottom, side etc. relate to the currently described and represented figure and in case of a change in position should be adjusted to the new position.

FIG. 1 shows a multi-layer sliding bearing 1 in the form of a sliding bearing half shell. A two-layered variant of the multi-layer sliding bearing 1 is shown consisting of a support layer 2 and a sliding layer 3, which is arranged on a front side 4 (radial inner side) of the multi-layer sliding bearing 1 which can be turned to face a component to be supported.

If necessary a bearing metal layer 5 can be arranged between the sliding layer 3 and the support layer 2, as indicated, by a dashed line in FIG. 1.

The principle structure of such a multi-layer sliding, bearing 1, as used for example in combustion engines, is known from the prior art so that fusilier explanations are unnecessary here, it should be mentioned however that additional layers can be provided, for example an adhesive layer and/or a diffusion barrier layer between the sliding layer 3 and the bearing metal layer 5, and also an adhesive layer can be arranged between the bearing metal layer 5 and the support layer 2.

Within the scope of the invention the multi-layer sliding bearing 1 can also be designed differently, for example as a bearing bush, as indicated in FIG. 1 by dashed lines. Likewise embodiments such as run-in rings, axially running sliding shoes or the like are possible.

The support metal layer 2 is preferably made of steel, but can also be made from, a material which gives the multi-layer sliding bearing 1 the necessary structural strength. Such materials are known from the prior art.

For the bearing metal layer 5 and the intermediate layers the alloys or materials known from the relevant prior art can be used and reference is made to the latter.

The sliding layer 3 consists of a tin-based alloy with tin as the main alloy element, i.e. the proportion of tin is the largest relative to the individual amounts of the additional alloy elements and alloy components.

Preferably, the total contents of the additional alloy elements and alloy components is between 15 wt. % and 34 wt. %, in particular between 20 wt. % and 30 wt. %. The remainder to 100 wt. % is formed by tin.

As additional alloy elements and alloy components in addition to tin the tin-based alloy preferably contains at least one of the alloy elements and alloy components listed in table 1. The second column lists the respective amount in wt. %, in the third column the respective preferred amount in wt. % and the third column lists the effects which are achieved by adding the respective element.

TABLE 1

| | Alloy elements | | |
|---|---|---|---|
| | wt. % | wt. % | Effect |
| Sb | 2-20 | 5-15 | solid solution strengthening (Snubs) |
| Sb sulfide(s) | 1-10 | 1-5 | solid lubricant |
| Sb oxide(s) | 1-7 | 1-3 | increase of conductivity |
| Cu | 0.2-15 | 0.5-5 | solid solution strengthening (Cu6Sn5) |
| Cu sulfide(s) | 0.5-8 | 1-4 | solid lubricant |
| Cu oxide(s) | 0.5-8 | 1-4 | increase of strength |
| In | 0.1-8 | 0.2-1.5 | reduction of corrosion by lubricant oil components |
| In sulfide(s) | 0.1-5 | 0.1-2 | solid lubricant |
| In oxide(s) | 0.1-5 | 0.1-2 | increase of conductivity |
| Bi | 0.1-2 | 0.2-0.5 | increase of strength |
| Bi sulfide(s) | 0.01-2 | 0.01-1 | solid lubricant |
| Bi oxide(s) | 0.01-2 | 0.01-1.5 | increase of strength |
| Pb | 0.1-2 | 0.2-0.5 | improvement of the load-bearing capacity |
| Pb sulfide(s) | 0.1-2 | 0.1-0.5 | solid lubricant |
| Pb oxide(s) | 0.1-2 | 0.1-0.5 | increase of conductivity |

In addition to said alloy elements and alloy components the tin-based alloy can also contain additional elements, such as in particular Zr, Si, Zn, Ni, Ag, wherein the total, proportion of the latter in the tin-based alloy is limited to a maximum of 3 wt. %.

The sliding layer 3 comprises on the surface, i.e. the front side 4, an oxidic subcoating 6, as shown in FIG. 2. The oxidic subcoating 6 is made at least partly from the tin of the tin-based alloy by oxidation. The proportion of tin oxide on the oxidic subcoating 6 is at least 50 wt. %, preferably at least 70 wt. %, in particular at least 90 wt. %. The oxidic subcoating 6 can however also be made completely from tin oxide(s).

Preferably, the oxidic subcoating extends over at least 80% of the surface, i.e. the area of the front side 4, in particular over at least 90%. However, it is also possible that the oxidic subcoating covers the whole surface, i.e. the whole running surface of the sliding bearing 1 in contact with the lubricant, in particular lubricant oil.

It is also preferable, if at least 50%, preferably at least 70%, in particular at least 90%, of the area of the oxidic subcoating has a layer thickness 7, which, is at least 0.1 μm, preferably at least 0.3 μm, and/or if at least 50%, preferably at least 70%, in particular at least 90%, of the area of the oxidic subcoating has a layer thickness 7 which is maximum of 2 μm, preferably a maximum of 0.7 μm. The layer thickness 7 is adjusted in particular over the period of producing the oxidic subcoating 6.

To produce the oxidic subcoating 6 the sliding layer 3 is deposited in a first step, in particular galvanically, onto the respective substrate, i.e. the support layer 2 or the bearing metal layer 5 or the intermediate layer, as explained above. Reference is made to AT 509 112 A1, in which particular reference is made to the deposition conditions and the electrolytes.

After the deposition of the sliding layer 3 the latter is subjected to oxidation. This is preferably performed by (electrochemical treatment in oxidizing solutions, such as for example an acidic (pH=3-4) permanganate solution etc. The temperature of the (electrochemical treatment can be between 80° C. and 150° C. If the oxidation is performed electrochemically, the sliding bearing is connected as an anode. The anodic oxidation can be performed at a voltage between 40 V and 60 V at a current density in a range of between 5 A/cm$^2$ and 15 A/cm$^2$.

According to another embodiment variant the electrolyte is preferably organic in nature, for example ammonium pentaborate in ethylene glycol can be used.

The anodic layer can also be formed in an organic electrolyte of the class of ionic liquids (for example 1-butyl-3-methyl-imidazolium-bis-(trifluoromethylsulfonyl)-imide). As in this way because of the large stability window hardly any side reactions (such as gas formation) can occur, the layer formation is performed until the voltage reaches a value of 40 V. The current drops until reaching a voltage of 1 A/dm$^2$ to below 0.05 A/dm$^2$. By selecting the stopping voltage the layer thickness can be adjusted to a limited degree. At 40 V a thickness of the oxide layer of on average about 0.15 µm is achieved.

However, also other oxidative treatments are possible, for example using hydrogen peroxide, by oxidation with a gas, such as for example carbon dioxide (50 vol. % to 100 vol. %), ozone, water vapor, etc. The temperature can also be between 80° C. and 150° C.

However, in addition to the preferred production of the oxidic subcoating 6 from at least one component of the sliding layer 3 it is also possible that the oxidic subcoating 6 is produced by deposition on the sliding layer 3, for example by means of gas phase deposition, or cathode sputtering. For example the sliding layer 3 can be deposited by reactive sputtering. For this the direct voltage can be between 1000 V and 3000 V at a discharge current of between 6 mA and 15 mA.

At the same time as or after the oxidizing treatment of the sliding layer 3 it is possible to sulfurize the sliding layer 3. For example, the oxidizing atmosphere H$_2$S or a mercaptan can be added. Thus the sulfides listed in table 1 can be produced, provided the latter have not already been added as sulfides.

In addition to the formation of the oxidic sub coating 6 it is also possible that the sliding layer 3 underneath the oxidic subcoating 6 has oxidic sections. Preferably, said oxidic sections also contain tin oxide(s). However, also other oxides can be provided, in particular those listed in table 1. The proportion of these oxides underneath the oxidic subcoating 6 is preferably between 0.5 wt. % and 15 wt. %. Said oxidic sections 8 can be introduced by admixing oxides to the alloy components to produce the sliding layer 3.

According to a further, preferred embodiment variant the tin oxide of the oxidic subcoating 6 contains more than 40 wt. %, in particular more than 70 wt. %, of the modification romarchite.

It is also possible that in addition to bivalent tin oxide tetravalent tin oxide is also contained in the oxidic subcoating 6. This is achieved by means of the thermal processing of the sliding layer 3.

In addition to making the oxidic subcoating 6 exclusively of tin oxide(s) it is possible that the oxidic subcoating 6 contains at least one further alloy element or further alloy component. The latter is or are selected in particular from the alloy elements or alloy components which are listed in table 1, wherein also the set amount ranges can be applied. In addition, the oxidic subcoating 6 can also contain at least one element from a group comprising or consisting of H, C, S. For example, the oxidic subcoating 6 can contain the additional alloy elements or alloy components listed in table 2. The details are given in wt. %. The remainder to 100 wt. % is formed respectively by tin oxide or tin oxides respectively.

For the sake of completion it should be noted at this point that the oxides can also be partly present in the oxidic subcoating 6 as hydroxides and/or oxyhydrates.

Antimony can be present as 3-valent and/or 5-valent and/or mixed 3-/5-valent oxide and/or sulfide.

Copper can be present as 1-valent and/or 2-valent oxide and/or sulfide.

Indium call be present as 3-valent oxide and/or sulfide.

Bismuth can be present as 3-valent and/or 5-valent oxide and/or sulfide.

Lead can be present as 2-valent and/or 4-valent and/or mixed 2-/4-valent oxide and/or sulfide.

These details relating to oxides and sulfides of the metals also relate to the sliding layer 3 and/or the oxidic subcoating 6. In addition, the metals themselves can also be present in the sliding, layer 3 and/or oxidic subcoating 6, as already explained above.

TABLE 2

Examples of the compositions of the oxidic subcoating 6

| | No. | | | | | | | | | | | | | | |
|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 |
| S | | | | | | | | | 1.5 | | | | 0.025 | | |
| Sb sulfide(s) | 2 | 7 | | | | | | | 8 | 5 | | 2.5 | 1 | 10 | |
| Sb oxide(s) | | | 3 | | 4 | | | | | 3 | | 1 | | 7 | |
| Cu sulfide(s) | | | | 7 | | | | | | 4 | | 1.8 | | | 8 |
| Cu oxide(s) | | | | | 2.4 | | | | | 1.5 | | 0.5 | | | 8 |
| In sulfide(s) | | | | | | 1.5 | 3.8 | | | | | 0.1 | | | |
| In oxide(s) | | | | | | | 4 | | | | 2.5 | 0.1 | | | |
| Bi sulfide(s) | | | | | | | | 0.9 | | | 1 | | | | |
| Bi oxide(s) | | | | | | | | 0.5 | | | 1.8 | | 0.7 | | |
| Pb sulfide(s) | | | | | | | | | | 0.1 | | | 0.7 | | |
| Pb oxide(s) | | | | | | | | | | 0.1 | | | | | |
| layer thickness [µm] | 0.15 | 1.15 | 0.45 | 0.85 | 1.5 | 0.4 | 1.1 | 0.25 | 1.3 | 1.6 | 0.75 | 0.8 | 0.9 | 1.8 | 1.9 |

In addition to the aforementioned alloy elements or alloy components the oxidic subcoating 6 can also comprise additional alloy components. In particular, the oxidic subcoating 6 can contain at least one further oxide from a group comprising or consisting of chromium oxide(s), molybdenum oxide(s), tungsten oxide(s), manganese oxide(s), nickel oxide(s).

For example, the oxidic subcoating 6 can contain $MnO_2$. For this the electrochemical oxidation can be performed in a permanganate solution at a pH of 3-4 and a temperature between 80 and 150° C. The anodic oxidation can be performed, at a voltage between 40 V and 60 V at a current density in a range of between 5 $A/cm^2$ and 15 $A/cm^2$.

To produce tungsten oxides an ammonium tungsten solution can be used. The deposition can be performed at a pH of between 8 and 9 and at a temperature of between 80° C. and 150° C. The voltage can be between 10 V and 20 V and the current density in a range of between 5 $A/dm^2$ and 15 $A/dm^2$.

The total proportion of chromium oxide(s), molybdenum oxide(s), tungsten oxide(s), manganese oxide(s), nickel oxide(s) can be between 4 wt. % and 15 wt. %.

In particular, the proportion of chromium oxide(s) can be between 0.1 wt. % and 6 wt. % and/or the proportion of molybdenum oxide(s) can be between 0.1 wt. % and 5 wt. % and/or the proportion of tungsten oxide(s) can be between 0.1 wt. % and 6.5 wt. % and/or the proportion of manganese oxide(s) can be between 0.1 wt. % and 8 wt. % and/or the proportion of nickel oxide(s) can be between 0.1 wt. % and 5 wt. %.

According to another embodiment variant the oxidic subcoating 6 has pores 9 and/or crack 10, as indicated by dashed lines in FIG. 2. This is achieved by a suitable adaptation of the galvanic baths and/or by the variation of the method parameters, for example in that shortly before completing the galvanic deposition of the sliding layer 3 the formation of gas in the galvanic bath is permitted.

The pores 9 can have a maximum diameter of between 0.5 μm and 3 μm and/or a pore depth between 0.1× of the layer thickness of the oxidic subcoating 6 and 1× the layer thickness of the oxidic subcoating 6.

The cracks 10 can have a length between 0.1× the layer thickness of the oxidic subcoating 6 and 5× the layer thickness of the oxidic subcoating 6 and/or a crack depth between 0.1× of the layer thickness of the oxidic subcoating 6 and 1× the layer thickness of the oxidic subcoating 6.

During tests on such multi-layer sliding bearings 1 a sliding bearing was produced consisting of a support layer 2 made of steel, a CuSn5Zn layer applied thereon, as a bearing metal layer 5, an Ni barrier layer applied thereon, a SnCu5 sliding layer 3 deposited galvanically thereon, which had an oxidic subcoating 6 of SnO. The layer thickness 7 of the oxidic subcoating 6 was between 0.3 μm and 0.7 μm.

As a comparison example the same multi-layer sliding bearing was produced, but without the oxidic subcoating 6.

For testing said two multi-layer sliding bearings 1 were subjected to laser screening. In this case the surfaces of the sliding layers 3 were scanned by a laser beam, under the same conditions so that the surfaces of the sliding layers 3 of the two multi-layer sliding bearings 1 heated up to the same temperature. Then the cooling of the sliding layers 3 was recorded over time.

In the multi-layer sliding bearing 1 with the oxidic subcoating 6 the temperature goes down much more slowly than in the multi-layer sliding bearing 1 without the oxidic subcoating 6. In addition, the surface of the comparison example was melted on.

Additional test samples were produced with sliding layers 3, which had at least one of the alloy elements or at least one of the alloy components according to table 1 and the amount proportions given in table 1.

All of these examples showed during laser screening, as described above, a much lower heating of the sliding layer 3, than the comparison sample with the same composition but without the oxidic subcoating. In further trials multi-layer sliding bearings 1 with oxidic sub coatings 6 were produced which consisted of 40 wt. % or 50 wt. % or 95 wt. % Sn(II)oxide in the modification romarchite. Said test samples were compared with sliding layers with oxidic subcoatings 6 which had a proportion of less than 40 wt. % Sn(II)oxide in the modification romarchite. It was shown that the temperature bearing capacity of the sliding layer 3 overtime and/or the level, of the temperature was improved by at least 10% than that of the sliding layers 3 with less than 40 wt. % romarchite.

The extent of the surface of the sliding layer 3 covered with the oxidic subcoating 6 was also studied. For this purpose test samples were produced, in which the surface of the sliding layer 3 was covered with the oxidic subcoating 6 by 50% or 60% or 70% or 80% or 90% or 100%. Surprisingly, it could be established that a full surface covering with the oxidic subcoating 6, i.e. an oxidic subcoating 6 fully covering the sliding layer 3, is not necessary to achieve the above effects. The critical extent of the surface coating was established during said test to be at least 50%.

In addition, the influence of pores 9 and cracks 10 on the effectiveness of the oxidic subcoating was studied. For this purpose the oxidic subcoating 6 was produced with pores 9 having a diameter corresponding, to the aforementioned values and cracks 10 having a crack length corresponding to the aforementioned values. After the test run of the multi-layer sliding bearing 1 the latter was subjected to the aforementioned laser screening, wherein surprisingly a better performance was achieved than with a multi-layer sliding bearing 1 having a pore and crack-free oxidic subcoating. A subsequent microscopic study showed that lubricant was embedded into the pores and cracks. The better performance is a result of this embedding.

The example embodiments describe, possible embodiment variants of the multi-layer sliding bearing 1, whereby it should be noted at this point that various different combinations of the individual embodiment variants are possible.

Finally, as a point of formality, it should be noted that for a better understanding of the structure of the multi-layer sliding bearing 1 the latter and its components have not been represented true to scale in part and/or have been enlarged and/or reduced in size.

LIST OF REFERENCE NUMERALS

1 multi-layer sliding bearing
2 support layer
3 sliding layer
4 front side
5 bearing metal layer
6 subcoating
7 layer thickness
8 section
9 pore
10 crack

The invention claimed is:
1. A multi-layer sliding bearing (1) comprising a sliding layer (3) having a surface for contacting a component to be supported, wherein the sliding layer (3) is made from a tin-based alloy with tin as the main alloy element, wherein the sliding layer (3) has on the surface, at least in some sections, an oxidic subcoating (6), in which the proportion of tin oxide(s) is at least 50 wt. %.

2. The multi-layer sliding bearing (1) as claimed in claim 1, wherein the oxidic subcoating (6) extends over at least 80% of the surface.

3. The multi-layer sliding bearing (1) as claimed in claim 1, wherein at least 50% of the area of the oxidic subcoating (6) has a layer thickness (7) which is at least 0.1 µm.

4. The multi-layer sliding bearing (1) as claimed in claim 1, wherein at least 50% of the area of the oxidic subcoating (6) has a layer thickness (7) which is maximum of 2 µm.

5. The multi-layer sliding bearing (1) as claimed in claim 1, wherein the sliding layer (3) has oxidic areas (8) underneath the oxidic subcoating (6).

6. The multi-layer sliding bearing (1) as claimed in claim 1, wherein there is more than 40 wt. % tin oxide in the modification romarchite.

7. The multi-layer sliding bearing (1) as claimed in claim 6, wherein in addition to romarchite there is also tetravalent tin oxide in the oxidic subcoating.

8. The multi-layer sliding bearing (1) as claimed in claim 1, wherein the oxidic subcoating (6) contains at least one alloy element and/or an alloy component, which is selected from the group consisting of carbon, hydrogen and sulfur.

9. The multi-layer sliding bearing (1) as claimed in claim 1, wherein the oxidic subcoating (6) contains at least one alloy element and/or one alloy component which is selected from the group consisting of antimony, copper, indium, bismuth, lead as well as the oxides of said elements and the sulfides of said elements.

10. The multi-layer sliding bearing (1) as claimed in claim 1, wherein the oxidic subcoating (6) comprises pores (9) and/or cracks (10).

* * * * *